(12) United States Patent
Oster et al.

(10) Patent No.: US 9,820,384 B2
(45) Date of Patent: Nov. 14, 2017

(54) FLEXIBLE ELECTRONIC ASSEMBLY METHOD

(71) Applicant: Intel Corporation, Santa Clara, CA (US)

(72) Inventors: Sasha Oster, Chandler, AZ (US); Robert L. Sankman, Phoenix, AZ (US); Charles Gealer, Phoenix, AZ (US); Omkar Karhade, Chandler, AZ (US); John S. Guzek, Chandler, AZ (US); Ravi V. Mahajan, Chandler, AZ (US); James C. Matayabas, Jr., Chandler, AZ (US); Johanna Swan, Scottsdale, AZ (US); Feras Eid, Chandler, AZ (US); Shawna Liff, Gilbert, AZ (US); Timothy McIntosh, Phoenix, AZ (US); Telesphor Kamgaing, Chandler, AZ (US); Adel Elsherbini, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 240 days.

(21) Appl. No.: 14/102,676

(22) Filed: Dec. 11, 2013

(65) Prior Publication Data

US 2015/0163921 A1 Jun. 11, 2015

(51) Int. Cl.
*H05K 1/18* (2006.01)
*H05K 13/04* (2006.01)
(Continued)

(52) U.S. Cl.
CPC ............ *H05K 1/189* (2013.01); *H01L 24/19* (2013.01); *H01L 24/96* (2013.01); *H05K 1/0393* (2013.01);
(Continued)

(58) Field of Classification Search
CPC ..... B29C 70/443; B29C 70/546; H01L 21/71; H01L 21/76; H01L 21/77; H01L 24/19;
(Continued)

(56) References Cited

U.S. PATENT DOCUMENTS

| 4,942,207 A | 7/1990 | Lee et al. |
| 5,659,952 A * | 8/1997 | Kovac ............... H01L 21/56 156/330 |

(Continued)

FOREIGN PATENT DOCUMENTS

| CN | 104716054 A | 6/2015 |
| DE | 102014116416 A1 | 6/2015 |
| WO | 2006094513 A2 * | 9/2006 |

OTHER PUBLICATIONS

"German Application Serial No. 102014116416.4, Office Action dated May 6, 2016", 16 pgs.
(Continued)

*Primary Examiner* — Carl Arbes
(74) *Attorney, Agent, or Firm* — Schwegman Lundberg & Woessner, P.A.

(57) ABSTRACT

This disclosure relates generally to devices, systems, and methods for making a flexible microelectronic assembly. In an example, a polymer is molded over a microelectronic component, the polymer mold assuming a substantially rigid state following the molding. A routing layer is formed with respect to the microelectronic component and the polymer mold, the routing layer including traces electrically coupled to the microelectronic component. An input is applied to the polymer mold, the polymer mold transitioning from the substantially rigid state to a substantially flexible state upon application of the input.

12 Claims, 7 Drawing Sheets

(51) Int. Cl.
*H01L 23/00* (2006.01)
*H05K 1/03* (2006.01)
*G06F 1/16* (2006.01)
*H01L 21/56* (2006.01)

(52) U.S. Cl.
CPC ......... *H05K 1/181* (2013.01); *H05K 13/0469* (2013.01); *G06F 1/163* (2013.01); *H01L 21/568* (2013.01); *H01L 2224/04105* (2013.01); *H01L 2224/12105* (2013.01); *H01L 2224/24137* (2013.01); *H01L 2924/12042* (2013.01); *H01L 2924/181* (2013.01); *H01L 2924/18162* (2013.01); *H05K 1/185* (2013.01); *H05K 2201/0137* (2013.01); *H05K 2203/1469* (2013.01); *Y10T 29/49146* (2015.01)

(58) Field of Classification Search
CPC ................ H01L 24/96; H01L 2924/00; H01L 2924/181; H01L 2924/12042; G06F 1/163; H05K 1/0393; H05K 1/181; H05K 1/185; H05K 1/189; H05K 2201/0137; H05K 2203/1469; Y10T 29/49146
See application file for complete search history.

(56) References Cited

U.S. PATENT DOCUMENTS

| | | | | |
|---|---|---|---|---|
| 5,808,874 A * | 9/1998 | Smith | ................... | H01L 21/563 257/E21.503 |
| 6,130,116 A * | 10/2000 | Smith | ..................... | H01L 21/56 257/E21.502 |
| 6,437,240 B2 * | 8/2002 | Smith | ........................... | 174/541 |
| 7,364,934 B2 * | 4/2008 | Street | ................ | H01L 27/14634 257/E25.012 |
| 7,851,906 B2 * | 12/2010 | Alcoe | ..................... | H01L 23/10 257/706 |
| 7,866,969 B2 * | 1/2011 | Ruiz | ..................... | B29C 70/546 425/112 |
| 2003/0129789 A1 | 7/2003 | Smith et al. | | |
| 2004/0251540 A1 | 12/2004 | Eguchi et al. | | |
| 2005/0158472 A1 | 7/2005 | Karthauser | | |
| 2008/0275327 A1 * | 11/2008 | Faarbaek | ............. | A61B 5/0002 600/382 |
| 2012/0052305 A1 | 3/2012 | Weber | | |
| 2013/0005088 A1 | 1/2013 | Han et al. | | |
| 2013/0075937 A1 | 3/2013 | Wang et al. | | |

OTHER PUBLICATIONS

Lee, M C, et al., "Synthesis of Tetrafunctional Epoxy Resins and Their Modification with Polydimethylsiloxane for Electronic Application.", Journal of Applied Polymer Science, 62, ISSN 002 1-8995, (1996), 217-225.

"Chinese Application Serial No. 201410627727.2, Office Action dated Feb. 20, 2017", w/ English Translation, 12 pgs.

"German Application Serial No. 102014116416.4, Response filed May 11, 2017 to Office Action dated May 6, 2016", w/o English Translation, 9 pgs.

"Chinese Application Serial No. 201410627727.2, Office Action dated Jul. 18, 2017", w/English Translation, 10 pgs.

"Chinese Application Serial No. 201410627727.2, Response filed Jun. 21, 2017 to Office Action dated Feb. 20, 2017", w/ English Claims, 13 pgs.

\* cited by examiner

FLEXIBLE ELECTRONIC ASSEMBLY METHOD

TECHNICAL FIELD

The disclosure herein relates generally to a flexible electronic assembly and related method therefor.

BACKGROUND

Certain electronic assemblies conventionally include electronic or microelectronic components placed on a circuit board. The electronic or microelectronic components (herein after "electronic components," without limitation) may include a semiconductor, such as a silicon die, encapsulated in a polymer and coupled to routing circuitry to form a chip package. The chip package may then be mechanically and communicatively coupled to a circuit board, over which the chip package may communicate with other electronic components.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Electronic assemblies are often substantially rigid owing, at least in part, to the components that make up the assemblies. The semiconductors, such as silicon dies, and encapsulants that are often used may be substantially inflexible and may themselves be attached to an inflexible circuit board. Even when the circuit board or other substrate is flexible, the electronic assembly as a whole may be inflexible around the electronic components.

An electronic assembly has been developed that incorporates one or more elements to promote flexibility. In an example, a flexible interpenetrating polymer network may be utilized in molding electronic components for the assembly. The interpenetrating polymer network may be processed in a substantially rigid state and transitioned to a flexible state. In an example, the mold assembly may be subjected to a thinning process to allow the silicon die to bend. In an example, dielectric layers of the electronic component may be provided with strain relief through a scribing and/or embossing process. In an example, a dielectric used in building the electronic component may have a low modulus to promote bendability.

Figure 1:
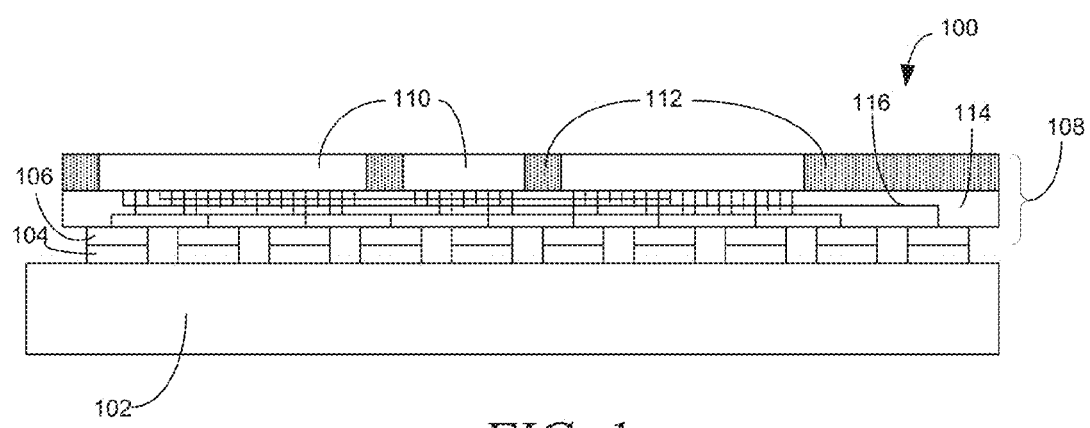
FIG. 1 is an abstract depiction of a flexible electronic assembly, in an example embodiment.

FIG. 1 is an abstract depiction of a flexible electronic assembly 100, in an example embodiment. The electronic assembly 100 includes a circuit board 102 with multiple pads 104. The pads 104 are coupled to solder balls 106 of a microelectronic assembly 108. As illustrated, the microelectronic assembly 108 includes multiple microelectronic components, such as dies 110, at least partially encapsulated in a mold 112. The dies 110 receive input and output via a routing layer 114 that includes traces 116 that couple the dies 110 to the solder balls 106. While the disclosure herein will refer to dies 110, it is to be recognized and understood that the dies 110 may be substituted for or included with microelectronic components generally, and that the various microelectronic components may be implemented according to the same or essentially the same principles disclosed herein. The microelectronic components may be or include, in addition or in the alternative to the dies 110, discrete microelectronic components, such as capacitors, resistors, transistors, and the like, and/or may be or include a prepackaged die or chip assembly.

It is to be understood that the electronic assembly 100 is purely illustrative and that many configurations of the electronic assembly 100 are contemplated. The microelectronic assembly 108 may include only a single die 110, the mold 112 may encapsulate the dies 110 to a greater or lesser extent, the microelectronic assembly 108 may include pads 104 rather than solder balls 106 while the circuit board may include solder balls 106 rather than pads 104, and so forth. It is to be understood that the electronic assembly 100 is generally scalable and configurable in various ways that remain consistent with the systems and processes disclosed herein. Further, while the electronic assembly 100 is described as an electronic assembly in contrast with the microelectronic assembly, it is to be understood that the electronic assembly 100 may itself be a microelectronic assembly and the microelectronic assembly 108 simply a subcomponent of the larger microelectronic assembly 100. Similarly, the microelectronic assembly 108 may be an electronic assembly, with such an electronic assembly 108 being part of the larger electronic assembly 100.

In various examples, the mold 112 is a polymer or a relatively soft, pliable material suitable for molding generally. In certain examples, the polymer is an interpenetrating polymer network (IPN). The IPN may be applied to the microelectronic assembly 108 in a substantially rigid form and then later processed to become substantially flexible. In various examples, the mold 112 is any material which may transition from a substantially rigid state to a substantially flexible state that includes the electrical and mechanical properties suitable for encapsulating, at least in part, the die 110. The various materials may transition based on an input to the material, such as from a chemical, such as a solvent, radiation, such as infrared or ultraviolet radiation, or temperature.

Figure 2A:
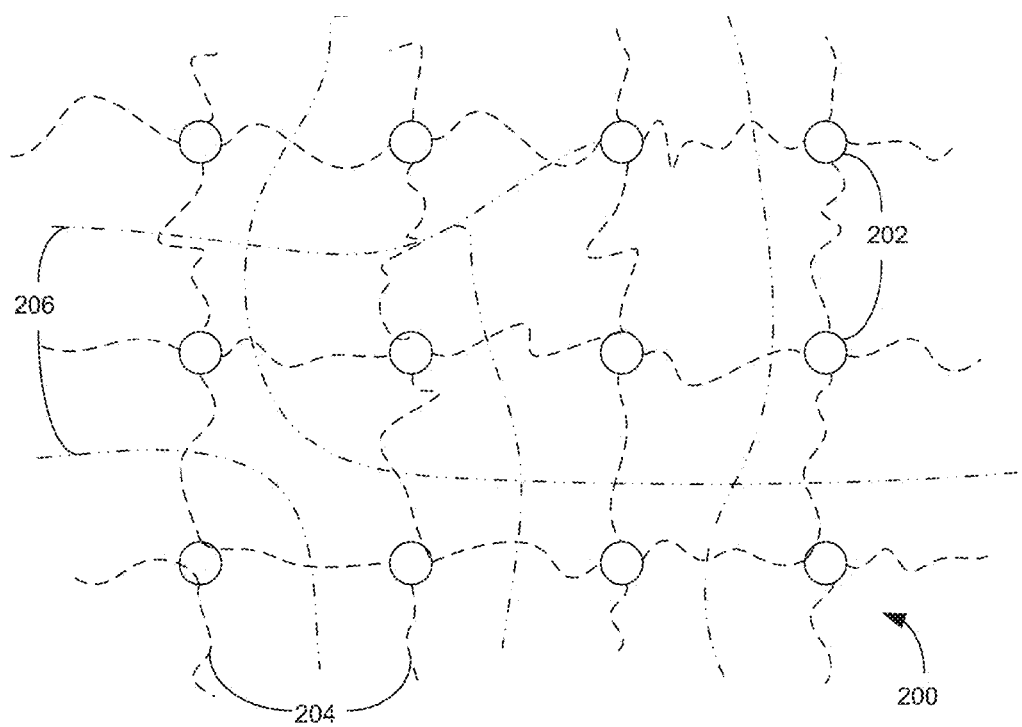
FIGS. 2A and 2B are abstract images of an interpenetrating polymer network and its chemical bonds in a rigid and in a flexible state, respectively, in an example embodiment.
Figure 2B:
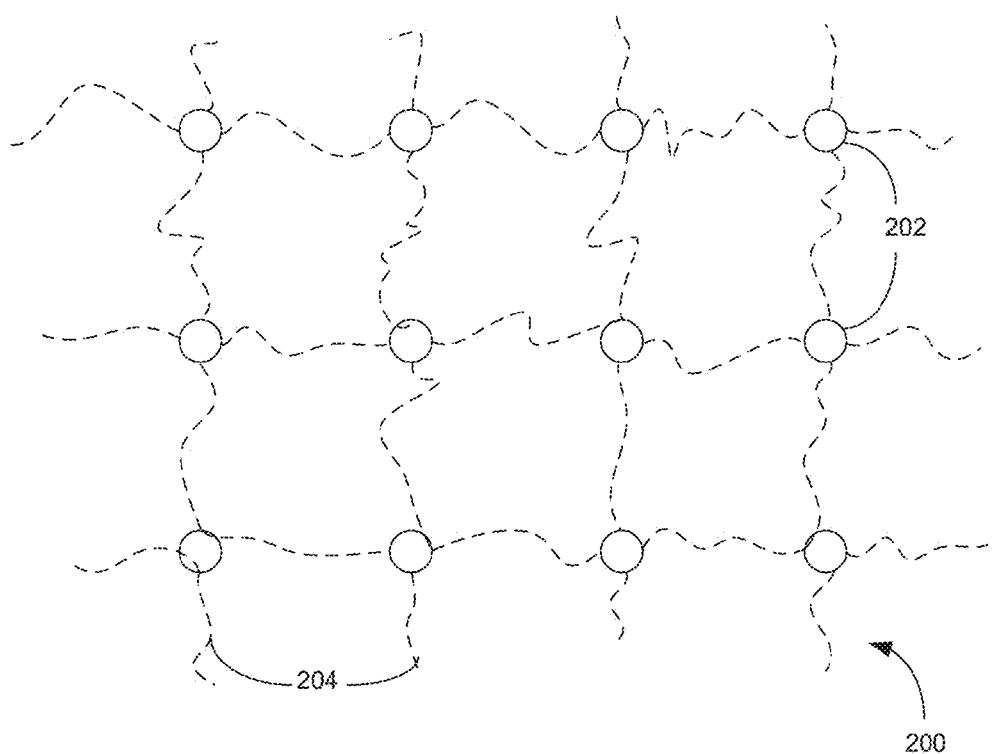

FIGS. 2A and 2B are abstract images of an IPN 200 and its chemical bonds in a rigid and in a flexible state, respectively. The image may depict a microstructure of the IPN 200 in the respective rigid and flexible states. As noted above, the IPN may be applied to the electronic assembly 100 in the rigid state and then transitioned into the flexible state. Depending on the specific IPN 200, the transformation may be effected by a chemical process, by the application of a laser, irradiation, or thermal energy, or by any of a variety of other processes, alone or in combination.

In an example, the IPN 200 is a flexible epoxy network that is covalently cross-linked with high molecular weight macromolecules between cross-links. Relatively long segments between cross-links may provide relatively high free-volume and relatively low modulus and flexibility. The cross-links could be both chemical or physical. Where the cross-link is physical, the link may be thermally reversible.

FIG. 2A shows the IPN 200 in the rigid state. The IPN 200 includes covalent bonds 202 between a first network of macromolecules 204 and a second network of macromolecules 206. The first network 204 is physically entangled with the second network 206, filling or substantially filling a free volume of the IPN 200. Thus, in an example, the second network 206 may dissolve at the application of, for instance, a solvent (among various potential inputs, as disclosed herein) that may leave the first network 204 fully or substantially chemically unaffected.

Solvents may be selected that dissolve, at least in part, the second network 206 while leaving the first network 204 completely or substantially intact. In an example, the solvent may be water where the second network 206 is one of polyethylene oxide or polypropylene oxide. In an alternative example, the solvent may be N-methyl-2-pyrrolidone.

FIG. 2B shows the IPN 200 in the flexible state following the application of a solvent, in the above example. With the application of the solvent, the second network 206 is dissolved leaving the first network 204 held together with the bonds 202. In an example, the bonds 202 are semi-permanent.

The IPN 200 may be a polyurethane, silane, acrylic, or polyimide, among numerous others polymer types. The IPN 200 may be physically entangled within the first network 204 and may have physical or chemical cross-links to itself. In an example, where the second network 206 is a polyurethane, the second network 206 it may be physically cross-linked to itself via hydrogen bonding and distinct and separate from the first network 204, such as when the first network 204 is an epoxy. Upon application of various solvents, such as dimethyl formamide, dimethyl acetamide, and/or tetrahydrofuran, the polyurethane second network 206 may be dissolved and removed from the epoxy first network 204 with minimal damage to the epoxy first network 204.

In various examples, the second network 206 may too contain cross-links to the first network 204. However; these links may be reversible, such as through thermal or irradiative treatment, and may enable a majority of the second network 206 to then be removed through chemical exposure. For example cross-links may be reversibly switched upon exposure to light at various wavelengths (photo-switchable) or cleaved (photo-cleaved). In various examples, an entirety of the second network 206 does not to be removed for the polymeric material to transition the IPN 200 from rigid to flexible.

FIGS. 3A-3H show a process for forming a flexible electronic assembly. In various examples, the process may form the flexible electronic assembly 100. Various steps of the process are optional and are not necessarily used to make a flexible electronic assembly, as appropriate. While the process detailed herein will be described with respect to certain components of the flexible electronic assembly 100 above, it is to be understood that the various components may be substituted for or replaced by alternative components, including alternative components of the same type as the components described with respect to the flexible electronic assembly 100.

Figure 3A:
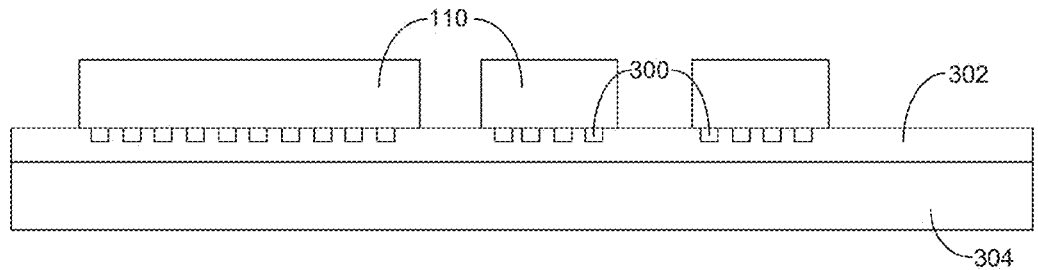
FIGS. 3A-3H show a process for forming a flexible electronic assembly, in an example embodiment.

In FIG. 3A, connectors 300 of multiple dies 110 are placed face down on an adhesive foil layer 302 coupled to a carrier 304. The dies 110 themselves may be adhered to the foil layer 302 in addition to or instead of the connectors 300. In general, the adhesive foil layer 302 in combination with the carrier 304 may serve to fix the dies 110 with respect to one another for further process steps. It is to be understood that the adhesive foil layer 302 and the carrier 304 may be any materials and/or structures that may secure the dies 110 with respect to one another and support further process steps. It is also to be understood that only a single die 110 may be utilized in various examples.

Figure 3B:
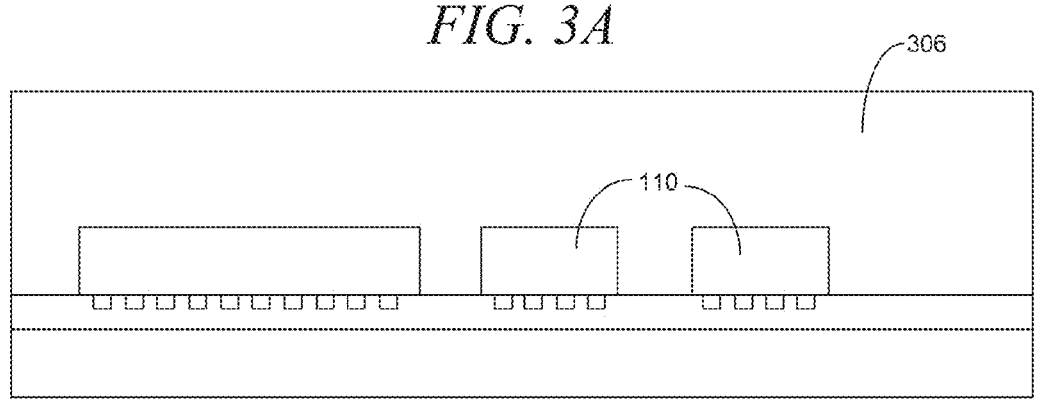

In FIG. 3B, a mold 306 is formed over the dies 110 and optionally cured, such as to provide rigidity. The mold 306 may ultimately be formed into the mold 112 disclosed herein in future process steps. The mold 306 may be formed from the same or similar materials as disclosed herein, including a polymer and, specifically, a full- or semi-IPN. While the mold 306 as illustrated envelops the dies 110, it is to be understood that the mold 306 may be formed in such a way as to be substantially coextensive with the height of the dies 110, as is the case with the mold 112.

Figure 3C:
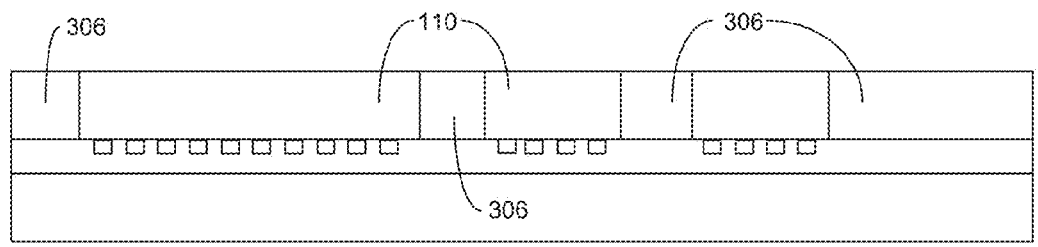

In FIG. 3C, the mold 306 is optionally ground back to be substantially coextensive with a height of the dies 110. In an example in which the dies 110 (or microelectronic components generally) have different heights, the mold 306 is ground back to be substantially coextensive with a height of a tallest one of the dies/microelectronic components 110. In various examples, the mold 306 takes on the form of the mold 112. The mold 306 is not necessarily ground down, but doing so may reduce an overall height of the microelectronic assembly 108 because the height of the mold 306 may be the same or essentially the same as the height of the dies 110.

Figure 3D:
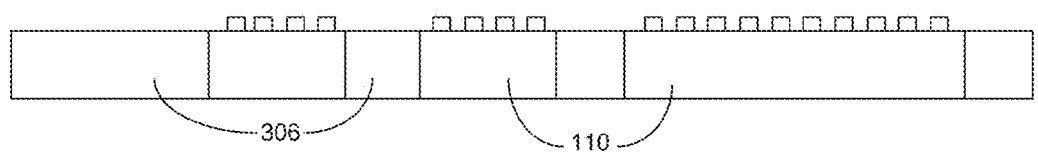

In FIG. 3D, the adhesive foil layer 302 and carrier 304 is removed and the dies 110 and mold 306 are flipped. The adhesive foil layer 302 may be removed by peeling the foil layer 302 from the dies 110 or by any suitable method. Flipping the dies 110 and mold 306 does not necessarily change a physical state of the dies 110 and mold 306 except to change their relative orientation for future process steps, as detailed herein.

Figure 3E:
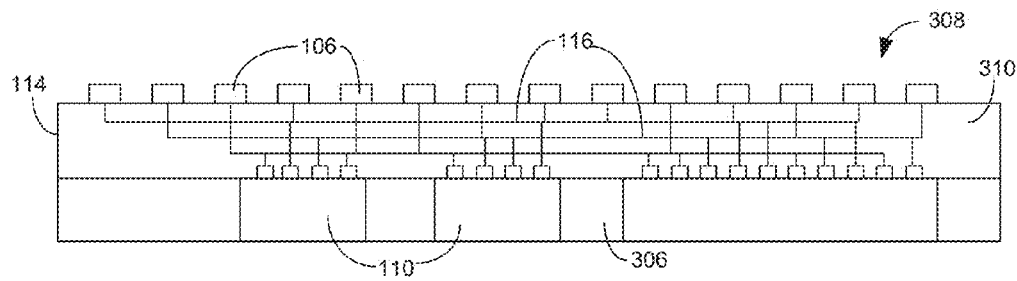

In FIG. 3E, the routing layer 114 and solder balls 106 are applied to the dies 110 and mold 306 to form a microelectronic assembly 308. The microelectronic assembly 308 may be the same as or similar to the microelectronic assembly 108. The routing layer 114 may be formed according to any of a variety of techniques or processes and with any of a variety of materials. In an example, the traces 116 of the routing layer are formed from copper and an insulator 310. The copper traces 116 and layers of the insulator 310 may be progressively added until the routing layer 114 as a whole is formed. Alternatively, the copper traces 116 may be formed and the insulator 310 formed around the traces 116. Additional or alternative processes may be implemented.

Figure 3F:
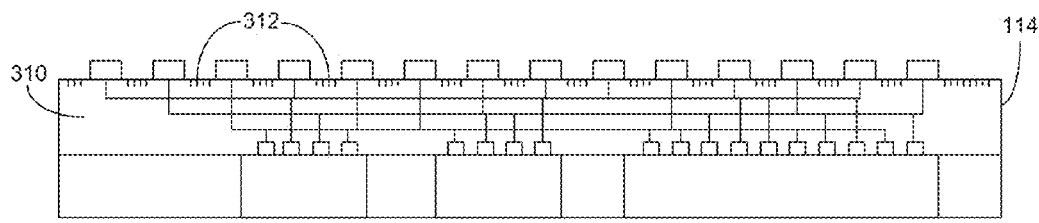

In FIG. 3F, the insulator 310 of the routing layer 114 is optionally scribed or embossed with grooves 312 to increase flexibility and provide strain relief, at least in part. In various examples, the grooves 312 are generally holes formed in the insulator 310 and may alternatively be dimples or other voids in the insulator that may provide strain relief. The grooves 312 may be formed according to any of a variety of laser etching, chemical patterning and/or etching, routing, cutting, or embossing techniques. The resulting routing layer 114 may be relatively more flexible than a routing layer 114 without the grooves 312. The grooves 312 may be any of a variety of configurations, including widths and depths, as desired and as may be supported by the overall structure of the routing layer 114. Thus, the grooves 312 may be as deep and as broad as the routing layer 114 may support.

Figure 3G:
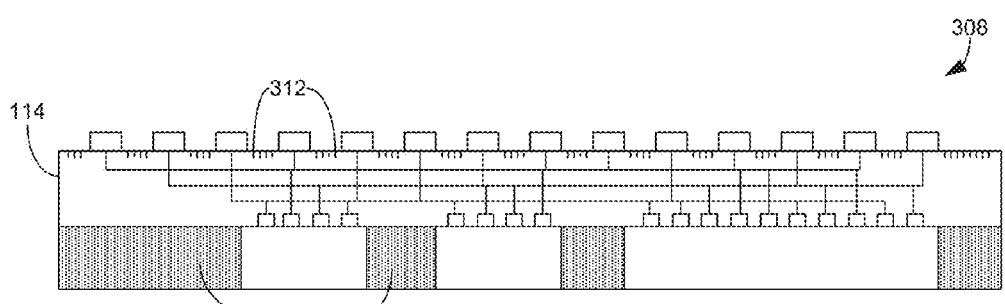

In FIG. 3G, the mold 306 is exposed to a solvent or other input to remove one component of the IPN 200 to reduce a modulus of the IPN 200 and increase flexibility, as disclosed above. In certain examples, the mold 306 is optionally exposed to the solvent. The resulting microelectronic assembly 308 may be consequently be relatively more flexible than if the mold 306 weren't processed as in this step or if the routing layer 114 didn't have grooves 312.

Figure 3H:
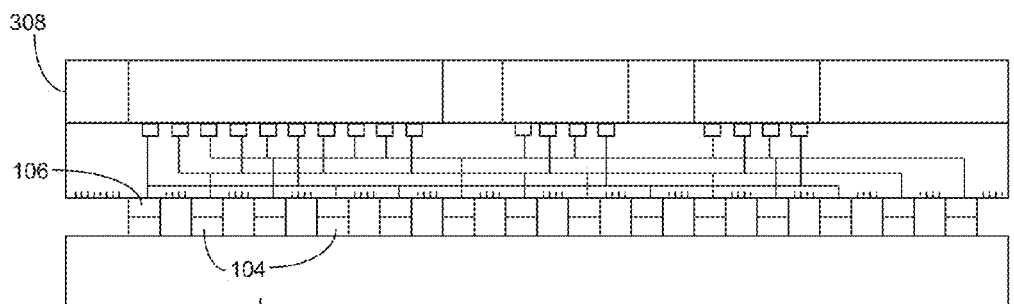

In FIG. 3H, the circuit board 102 is coupled to the microelectronic assembly 308 to form a flexible electronic assembly 314. The solder balls 106 may be soldered to the pads 104 to mechanically and electrically couple the circuit board 102 to the microelectronic assembly 308. In various examples, alternative assembly processes, such as using anisotropic conducting film (ACF) or anisotropic conducting paste (ACP). As noted above, the circuit board 102 may be a flexible circuit board to promote the general flexibility of the flexible electronic assembly 314. The process disclosed herein may be in a variety of sequences, as appropriate. In an example, the step of FIG. 3G may optionally be performed prior to the step of FIG. 3F.

Figure 4A:
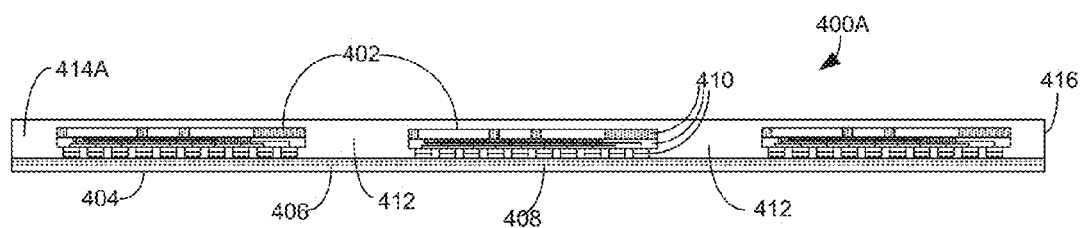
FIGS. 4A and 4B are depictions of examples of a flexible electronic devices, each including multiple component stacks, in example embodiments.
Figure 4B:
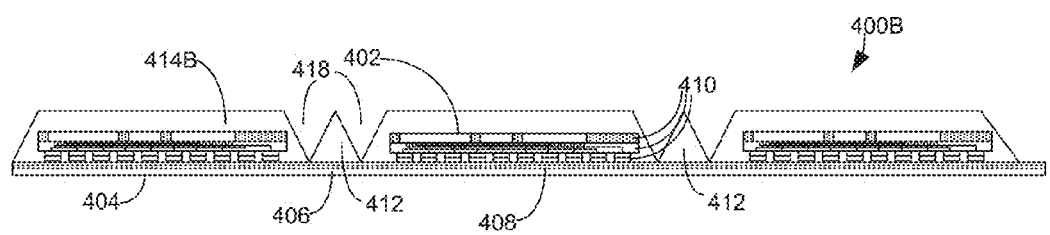

FIGS. 4A and 4B are depictions of examples of a flexible electronic devices 400A, 400B (collectively "devices 400"), each including multiple component stacks 402. The devices 400 include a flexible base layer 404, such as a flexible circuit board or cable, as disclosed herein. In various examples, the component stacks 402 are or include the microelectronic assemblies 108, 308 as disclosed herein and the base layer 404 is the circuit board 102 as disclosed herein. Alternatively, the electronic assemblies 100, 314 are the component stacks 402 and are coupled to the flexible base layer 404. Alternatively, the component stacks 402 are not related to the electronic assemblies 100, 314.

The flexible base layer 404 may include a single layer 406 incorporating conductive lines 408, such as traces and/or a power bus. The single layer 406 may be a flexible substrate and the conductive lines 408 may be sufficiently thin to promote overall flexibility of the flexible base layer 404 and the electronic devices 400 generally.

The component stacks 402 include multiple layers 410. The layers 410 may include any one or more of the circuit board 102, the die 110, the mold 112, and the routing layer 114. The layers 410 may include additional or alternative electronic component layers that may be desired to be included in the flexible electronic devices 400. As noted above, the component stacks 402 optionally do not include any of the components of the electronic assemblies 100, 314.

In general, the single layer 406 of the flexible base layer 404 may promote general flexibility of the devices 400 while the component stacks 402 may be relatively less flexible than the base layer 404 owing, at least in part to the multiple layers 410 of the stack 402. The stacks 402 are separated by gaps 412 in which an electronic component thickness of the devices 400 is only or essentially only the thickness of the flexible base layer 404, i.e., the thickness of the single layer 406. Thus, the electronic devices may be relatively more flexible in the lateral regions corresponding to the gaps 412 between the stacks 402 than in the regions corresponding to the stacks 402 themselves. The presence of the gaps 412, however, may promote the general and overall flexibility of the devices 400.

The devices 400A, 400B each include an overmold 414A, 414B, respectively (collectively, overmolds 414). The overmolds 414 may be molded from a flexible polymer or other suitable material. The overmolds 414 may encapsulate and substantially protect the component stacks 202 and flexible base layer 404.

The overmold 414A is essentially uniform and of a substantially constant height 416 while the overmold 414B includes grooves 418 as illustrated. The grooves 418 may be formed from a mold which is used to create the overmold 414B or may be carved, scribed, embossed, or otherwise cut out of an overmold, such as the overmold 414A. The grooves 414B may promote flexibility in the flexible electronic device 400B.

Figure 5:
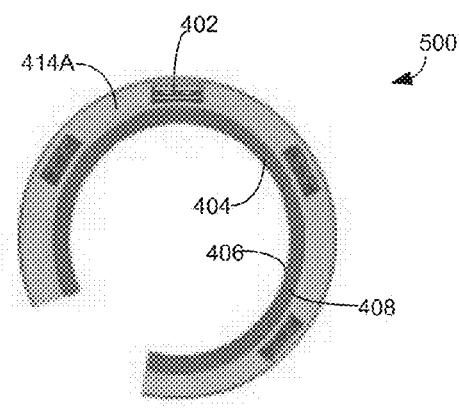
FIG. 5 shows a flexible electronic device configured as a wearable electronic device, in an example embodiment.

FIG. 5 shows a flexible electronic device configured as a wearable electronic device 500. As illustrated, the wearable electronic device 500 is based on the flexible electronic device 400A, though it is to be understood that a wearable electronic device may be formed from the flexible electronic device 400B as well as any other suitable flexible electronic device.

The wearable electronic device 500 is configured, in various examples, to be worn as a ring, a wrist or ankle bracelet, or other piece of wearable clothing or accessory. In such examples, the wearable electronic device 500 may be sized as appropriate for conventional sizes of such articles. The overmold 414A and/or the flexible base layer 404 may be biased to retain the general shape of the wearable electronic device 500, as illustrated a ring. It is to be recognized that, while a ring shape is illustrated, the wearable electronic device 500 may be formed into any of a variety of shapes and configurations. The wearable electronic device 500 may maintain its general flexibility, thus allowing the wearable electronic device 500 to be flexed straight or into any of a variety of configurations. The bias on the wearable electronic device 500 may cause the wearable electronic device 500 to return to its biased shape upon the removal of a flexing pressure or force.

The wearable electronic device 500 may incorporate any suitable electronic function that may be implemented by electronics in the component stacks 402. The component stacks 402 may be mounted on the flexible base layer 404 using embedded die technology, wire bonding, a chip attach module (CAM) or flip-chip reflow, or thermal compression bonding, among other suitable methods. The flexible base layer 404 may include discrete components, such as chip antennas and a crystal. Coplanar waveguides may be used to reduce signal interference on the conductive lines 408. A chip or planar integrated antenna may be formed from the conductive lines 408.

In an example, the flexible base layer 404 is built monolithically using an embedded die or build-up layer process. Alternatively, discrete components of the stacks 402 are assembled on the flexible base layer 404 using flip-chp assembly or thermal compression bonding. Alternatively, the stacks 402 are formed separately and then mounted on the flexible base layer 404. The overmold 414 may then be molded on top of the sack 402 and base layer 404 combination. A photodefinable dielectric may be utilized to facilitate removal of dielectric material in the gaps 412.

Figure 6:
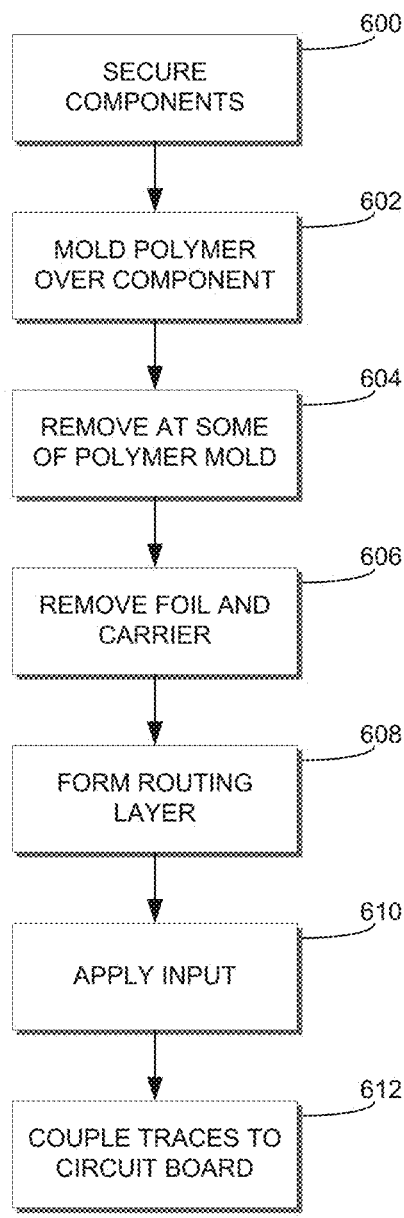
FIG. 6 is a flowchart for making a flexible electronic assembly, in an example embodiment.

FIG. 6 is a flowchart for building a flexible microelectronic assembly, in an example embodiment. The flowchart may be utilized to make microelectronic assemblies disclosed herein or any of a variety of suitable microelectronic assemblies.

At 600, microelectronic components are optionally secured with respect to one another with an adhesive foil and a carrier.

At 602, a polymer mold is molded over a microelectronic component, the polymer mold assuming a substantially rigid state following the molding. In an example, the polymer mold is formed, at least in part, from an interpenetrating polymer network. In an example, the interpenetrating polymer network includes a first network of macromolecules and a second network of macromolecules, and wherein the input causes the second network of macromolecules to at least partially dissolve while leaving the first network of macromolecules substantially intact. In an example, molding the polymer mold includes molding the polymer mold over a plurality of microelectronic components. In an example, at least some of the microelectronic components are dies. In an example, applying the polymer mold includes surrounding the microelectronic components and contacting the adhesive foil with the polymer mold.

At 604, some of the polymer mold is optionally removed so that a height of the polymer mold is approximately coextensive with a height of the microelectronic component.

At 606, the adhesive foil and the carrier are optionally removed.

At 608, a routing layer is formed with respect to the microelectronic component and the polymer mold, the routing layer including traces electrically coupled to the microelectronic component. In an example, the routing layer further includes an insulator, and further comprising forming holes in the insulator. In an example, the holes are grooves and wherein forming the grooves includes at least one of embossing, etching, and scribing.

At 610, an input is applied to the polymer mold, the polymer mold transitioning from the substantially rigid state to a substantially flexible state upon application of the input. In an example, the input is at least one of a solvent, an increase in ambient temperature, and radiation. In an example, the radiation is at least one of infrared radiation and ultraviolet radiation.

At 612, the traces of the routing layer are optionally coupled to a circuit board. In an example, the circuit board is a flexible circuit board.

Figure 7:
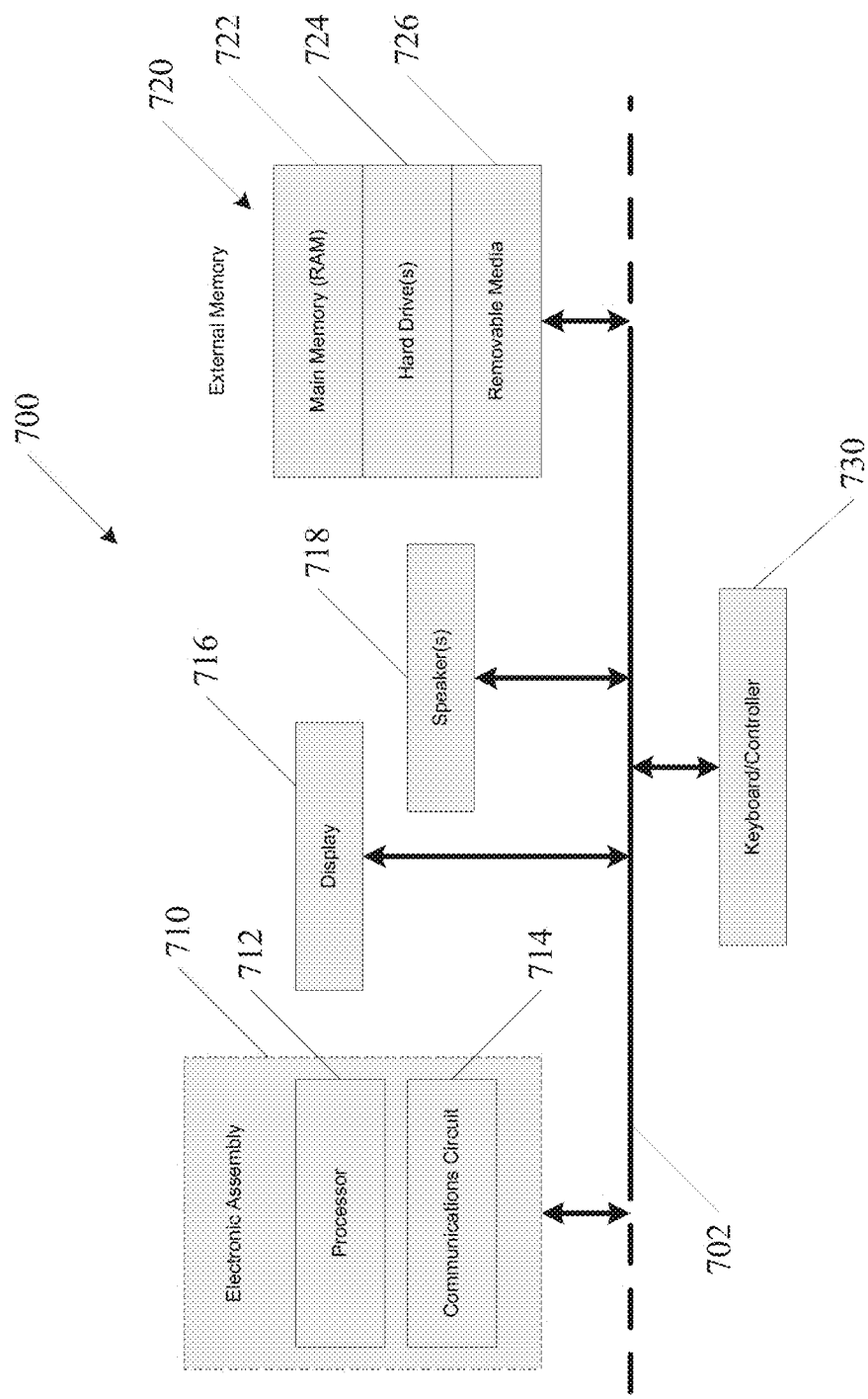
FIG. 7 is a block diagram of an electronic device incorporating at least one microelectronic assembly, in an example embodiment.

An example of an electronic device using electronic assemblies as described in the present disclosure is included to show an example of a higher level device application for the disclosed subject matter. FIG. 7 is a block diagram of an electronic device 700 incorporating at least one microelectronic assembly, such as a microelectronic assembly 100, 400 or other microelectronic assembly described in examples herein. The electronic device 700 is merely one example of an electronic system in which embodiments of the present invention can be used. Examples of electronic devices 700 include, but are not limited to personal computers, tablet computers, mobile telephones, personal data assistants, MP3 or other digital music players, wearable devices, etc. In this example, the electronic device 700 comprises a data processing system that includes a system bus 702 to couple the various components of the system. The system bus 702 provides communications links among the various components of the electronic device 700 and can be implemented as a single bus, as a combination of busses, or in any other suitable manner.

An electronic assembly 710 is coupled to the system bus 702. The electronic assembly 710 can include any circuit or combination of circuits. In one embodiment, the electronic assembly 710 includes a processor 712 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 710 are a custom circuit, an application-specific integrated circuit (ASIC), or the like, such as, for example, one or more circuits (such as a communications circuit 714) for use in wireless devices like mobile telephones, pagers, personal data assistants, portable computers, two-way radios, wearable device, and similar electronic systems. The IC can perform any other type of function.

The electronic device 700 can also include an external memory 720, which in turn can include one or more memory elements suitable to the particular application, such as a main memory 722 in the form of random access memory (RAM), one or more hard drives 724, and/or one or more drives that handle removable media 726 such as compact disks (CD), digital video disk (DVD), and the like.

The electronic device 700 can also include a display device 716, one or more speakers 718, and a keyboard and/or controller 730, which can include a mouse, trackball, touch screen, voice-recognition device, or any other device that permits a system user to input information into and receive information from the electronic device 700.

Additional Examples

Example 1 may include subject matter (such as an apparatus, a method, a means for performing acts) that can include molding a polymer mold over a microelectronic component, the polymer mold assuming a substantially rigid state following the molding, forming a routing layer with respect to the microelectronic component and the polymer mold, the routing layer including traces electrically coupled to the microelectronic component, and applying an input to the polymer mold, the polymer mold transitioning from the substantially rigid state to a substantially flexible state upon application of the input.

In Example 2, the method of Example 1 optionally further includes that the input is at least one of a solvent, an increase in ambient temperature, and radiation.

In Example 3, the method of any one or more of Examples 1 and 2 optionally further includes that the radiation is at least one of infrared radiation and ultraviolet radiation.

In Example 4, the method of any one or more of Examples 1-3 optionally further includes that the polymer mold is formed, at least in part, from an interpenetrating polymer network.

In Example 5, the method of any one or more of Examples 1-4 optionally further includes that the interpenetrating polymer network includes a first network of macromolecules and a second network of macromolecules, and that the input causes the second network of macromolecules to at least partially dissolve while leaving the first network of macromolecules substantially intact.

In Example 6, the method of any one or more of Examples 1-5 optionally further includes that the routing layer further includes an insulator, and further comprising forming holes in the insulator.

In Example 7, the method of any one or more of Examples 1-6 optionally further includes that the holes are grooves and wherein forming the grooves includes at least one of embossing, etching, and scribing.

In Example 8, the method of any one or more of Examples 1-7 optionally further includes that the molding the polymer mold includes molding the polymer mold over a plurality of microelectronic components.

In Example 9, the method of any one or more of Examples 1-8 optionally further includes that at least some of the microelectronic components are dies.

In Example 10, the method of any one or more of Examples 1-9 optionally further includes securing the microelectronic components with respect to one another with an adhesive foil and a carrier, wherein applying the polymer mold comprises surrounding the microelectronic components and contacting the adhesive foil with the polymer mold.

In Example 11, the method of any one or more of Examples 1-10 optionally further includes removing the adhesive foil and the carrier prior to forming the routing layer.

In Example 12, the method of any one or more of Examples 1-11 optionally further includes removing some of the polymer mold so that a height of the polymer mold is approximately coextensive with a height of the microelectronic component.

In Example 13, the method of any one or more of Examples 1-12 optionally further includes coupling the traces of the routing layer to a circuit board.

In Example 14, the method of any one or more of Examples 1-13 optionally further includes that the circuit board is a flexible circuit board Example 15 may include subject matter (such as an apparatus, a method, a means for performing acts) that can include a microelectronic component and a polymer mold encapsulating, at least in part, the microelectronic component, wherein the polymer mold includes a modulus reducing input at least partially interspersed within a microstructure of the polymer.

In Example 16, the electronic assembly of Example 15 optionally further includes that the polymer mold includes an interpenetrating polymer network.

In Example 17, the electronic assembly of any one or more of Examples 15 and 16 optionally further includes that the interpenetrating polymer network includes a first network of macromolecules and a second network of macromolecules, and wherein the input causes the second network of macromolecules to at least partially dissolve while leaving the first network of macromolecules substantially intact.

In Example 18, the electronic assembly of any one or more of Examples 15-17 optionally further includes that the routing layer further includes an insulator forming holes.

In Example 19, the electronic assembly of any one or more of Examples 15-18 optionally further includes that the holes are grooves formed via at least one of embossing, etching, and scribing.

In Example 20, the electronic assembly of any one or more of Examples 15-19 optionally further includes a plurality of microelectronic components, wherein the microelectronic component is one of the plurality of microelectronic components.

In Example 21, the electronic assembly of any one or more of Examples 15-20 optionally further includes that at least some of the microelectronic components are dies.

In Example 22, the electronic assembly of any one or more of Examples 15-21 optionally further includes that a circuit board, the traces of the routing layer being coupled to the circuit board.

In Example 23, the electronic assembly of any one or more of Examples 15-22 optionally further includes that the circuit board is a flexible circuit board.

Example 24 may include subject matter (such as an apparatus, a method, a means for performing acts) that can include a flexible base layer comprising only a single layer, and a plurality of component stacks coupled to the base layer, each of the plurality of component stacks comprising a microelectronic component and a polymer mold encapsulating, at least in part, the microelectronic component, wherein the polymer mold includes a modulus reducing input at least partially interspersed within a microstructure of the polymer.

In Example 25, the electronic assembly of Example 24 optionally further includes that the polymer mold includes an overmold encapsulating, at least in part, the plurality of component stacks.

In Example 26, the electronic assembly of any one or more of Examples 24 and 25 optionally further includes that the overmold forms grooves at least partially between individual ones of the component stacks.

In Example 27, the electronic assembly of any one or more of Examples 24-26 optionally further includes that the flexible base layer is biased in a form configured to be wearable by a person.

In Example 28, the electronic assembly of any one or more of Examples 24-27 optionally further includes that the electronic assembly is biased to form at least a partial ring.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method, comprising:
   securing microelectronic components with respect to one another with an adhesive foil and a carrier;
   molding a polymer mold over the plurality of microelectronic components by surrounding the microelectronic components and contacting the adhesive foil with the polymer mold, the polymer mold assuming a substantially rigid state following the molding;
   forming a routing layer with respect to the microelectronic component and the polymer mold, the routing layer including traces electrically coupled to the microelectronic component;
   applying an input to the polymer mold, the polymer mold transitioning from the substantially rigid state to a substantially flexible state upon application of the input.

2. The method of claim 1, wherein the input is at least one of a solvent, an increase in ambient temperature, and radiation.

3. The method of claim 2, wherein the radiation is at least one of infrared radiation and ultraviolet radiation.

4. The method of claim 1, wherein the polymer mold is formed, at least in part, from an interpenetrating polymer network.

5. The method of claim 4, wherein the interpenetrating polymer network includes a first network of macromolecules and a second network of macromolecules, and wherein the input causes the second network of macromolecules to at least partially dissolve while leaving the first network of macromolecules substantially intact.

6. The method of claim 1, wherein the routing layer further includes an insulator, and further comprising forming holes in the insulator.

7. The method of claim 6, wherein the holes are grooves and wherein forming the grooves includes at least one of embossing, etching, and scribing.

8. The method claim 1, wherein at least some of the microelectronic components are dies.

9. The method of claim 1, further comprising removing the adhesive foil and the carrier prior to forming the routing layer.

10. The method of claim 1, further comprising removing some of the polymer mold so that a height of the polymer mold is approximately coextensive with a height of at least one of the microelectronic components.

11. The method of claim 1, further comprising coupling the traces of the routing layer to a circuit board.

12. The method of claim 11, wherein the circuit board is a flexible circuit board.

* * * * *

UNITED STATES PATENT AND TRADEMARK OFFICE
CERTIFICATE OF CORRECTION

PATENT NO. : 9,820,384 B2
APPLICATION NO. : 14/102676
DATED : November 14, 2017
INVENTOR(S) : Oster et al.

Page 1 of 1

It is certified that error appears in the above-identified patent and that said Letters Patent is hereby corrected as shown below:

In the Claims

Column 12, Line 22, Claim 8, after "method", insert --of--

Signed and Sealed this
Second Day of July, 2019

Andrei Iancu
*Director of the United States Patent and Trademark Office*